(12) United States Patent
Ratliff et al.

(10) Patent No.: US 6,300,739 B1
(45) Date of Patent: Oct. 9, 2001

(54) LOW COST LIMITED ANGLE TORQUE DC BRUSHLESS SERVOMOTOR AND METHOD FOR FABRICATING THEREOF

(75) Inventors: William Edward Ratliff, Acton; John Jay Starbird, Ojai; Kim Lige Coakley, Moorpark, all of CA (US)

(73) Assignee: HR Textron Inc., Valencia, CA (US)

( * ) Notice: Subject to any disclaimer, the term of this patent is extended or adjusted under 35 U.S.C. 154(b) by 0 days.

(21) Appl. No.: 09/455,036

(22) Filed: Dec. 6, 1999

(51) Int. Cl.$^7$ .................................................. H02K 26/00
(52) U.S. Cl. ........................... 318/689; 318/538; 318/437
(58) Field of Search .................................... 318/689, 494, 318/538–542, 437, 491

(56) References Cited

U.S. PATENT DOCUMENTS

| | | |
|---|---|---|
| 3,182,244 * | 5/1965 | Fitzroy, Jr. et al. ................. 318/489 |
| 3,599,165 | 8/1971 | Wendell et al. . |
| 4,046,441 | 9/1977 | Harley . |
| 4,086,519 | 4/1978 | Persson . |
| 4,476,404 | 10/1984 | Bygdnes . |
| 4,607,898 | 8/1986 | Reighard et al. . |
| 4,661,733 | 4/1987 | Heyraud . |
| 4,742,322 | 5/1988 | Johnson et al. . |
| 4,862,050 * | 8/1989 | Parfomak et al. .................... 318/689 |
| 5,023,498 | 6/1991 | Abe . |
| 5,070,289 * | 12/1991 | Pona, Jr. ............................... 318/640 |
| 5,102,061 | 4/1992 | Suzuki et al. . |
| 5,313,128 | 5/1994 | Robinson et al. . |
| 5,336,956 | 8/1994 | Haner . |
| 5,493,159 | 2/1996 | Norris . |
| 5,619,112 * | 4/1997 | Younessi et al. .................... 318/689 |
| 5,753,985 | 5/1998 | Redlich . |

FOREIGN PATENT DOCUMENTS

P 42 17 664.6   5/1992   (DE) .
518098          2/1940   (GB) .

* cited by examiner

Primary Examiner—Bentsu Ro
(74) Attorney, Agent, or Firm—Fulbright & Jaworski L.L.P.

(57) ABSTRACT

A novel low cost limited angle torque DC brushless servomotor is disclosed. The motor itself is a modified standard low cost DC brush motor which is modified by removing the brush assembly and substituting in its place an appropriately configured multiconductor flexible circuit which is coupled between a controller, the commutator and a magnetic rotor shaft angular displacement sensor. The flexible circuit has a dual function—it provides on one hand the conduit for electrical communication between the controller and the commutator and on the other hand between the sensor and the controller. Part of the circuit is supported between a bearing assembly and the commutator and flexes in consonance with the controlled limited angular rotation of the rotor without affecting performance or reliability of the motor. The rest of the circuit remains stationary during motor operation. The bearing assembly supports the sensor and is used to mount the motor in a housing for a pneumatic servovalve or the like. The sensor comprises a conventional surface mount Hall effect device which on one side is soldered directly to a portion of the flexible circuit and on the other side is glued to the bearing assembly in proximity to a permanent ring-shaped Hall magnet which is fixed concentrically on the rotor shaft. The sensor provides a feedback signal to the controller regarding the angular rotor displacement from a pre-determined null position. The controller compares the feedback signal to an external command signal and drives the rotor (and spool if it is a pneumatic servovalve application) to the commanded position when it detects an error via the flexible circuit.

54 Claims, 6 Drawing Sheets

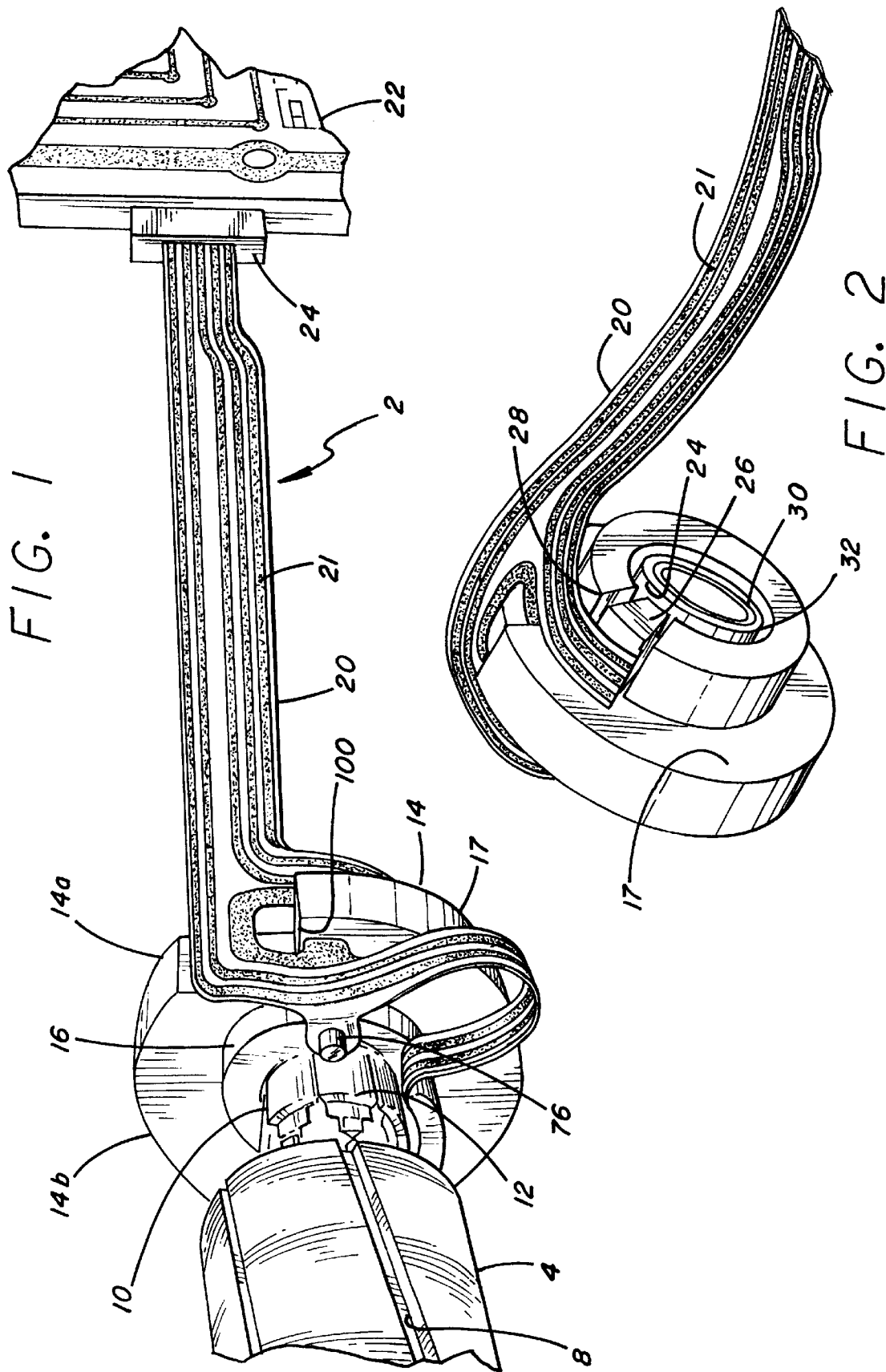

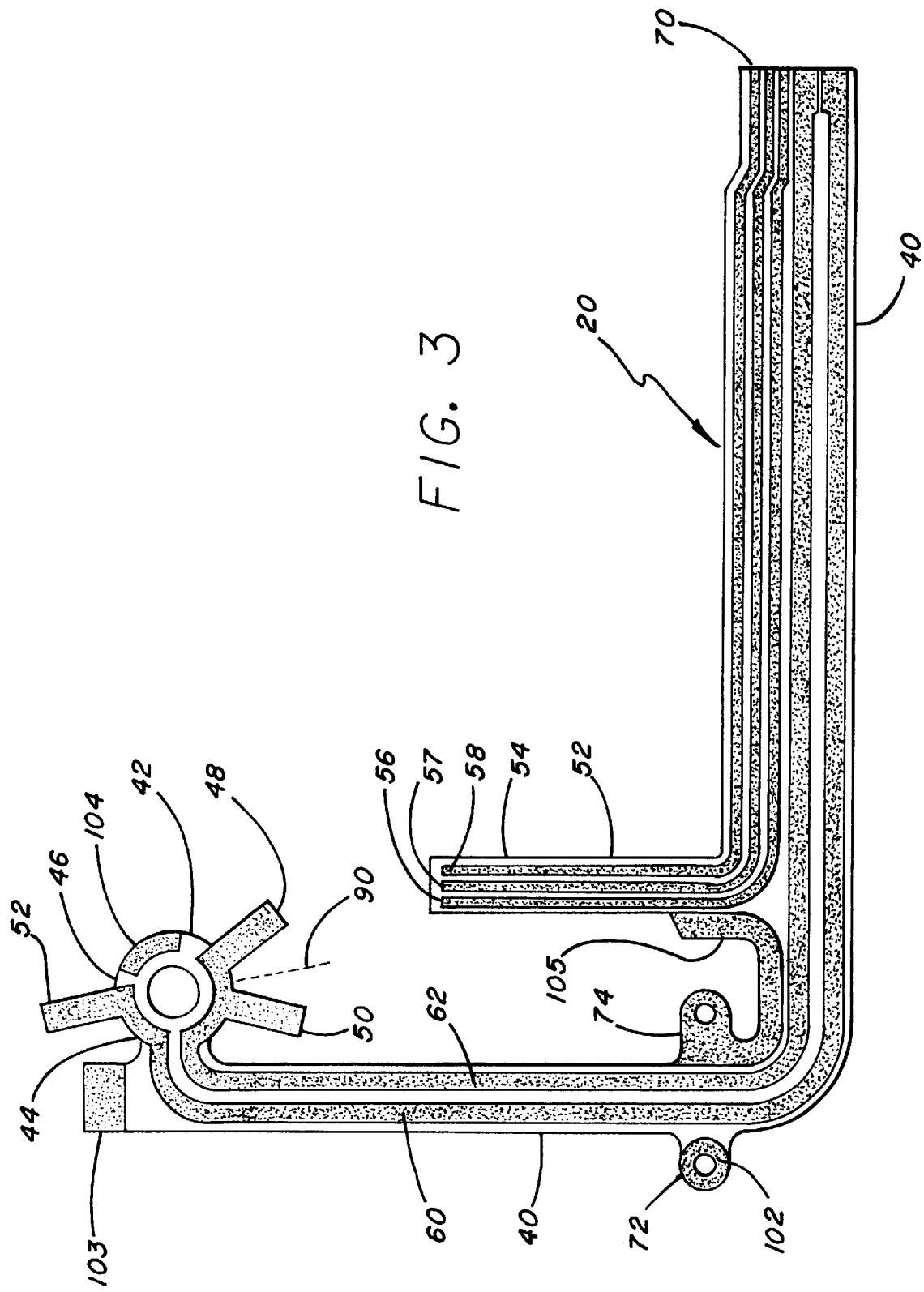

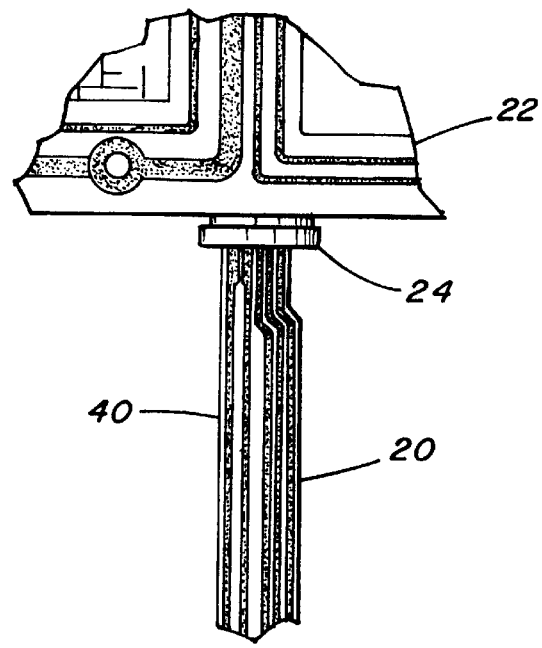
FIG. 4
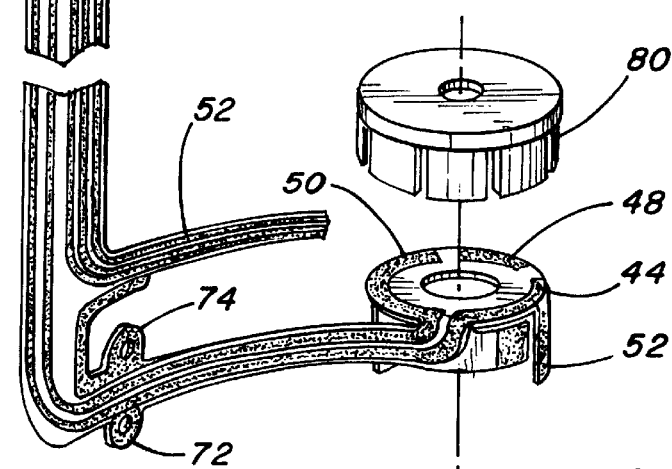
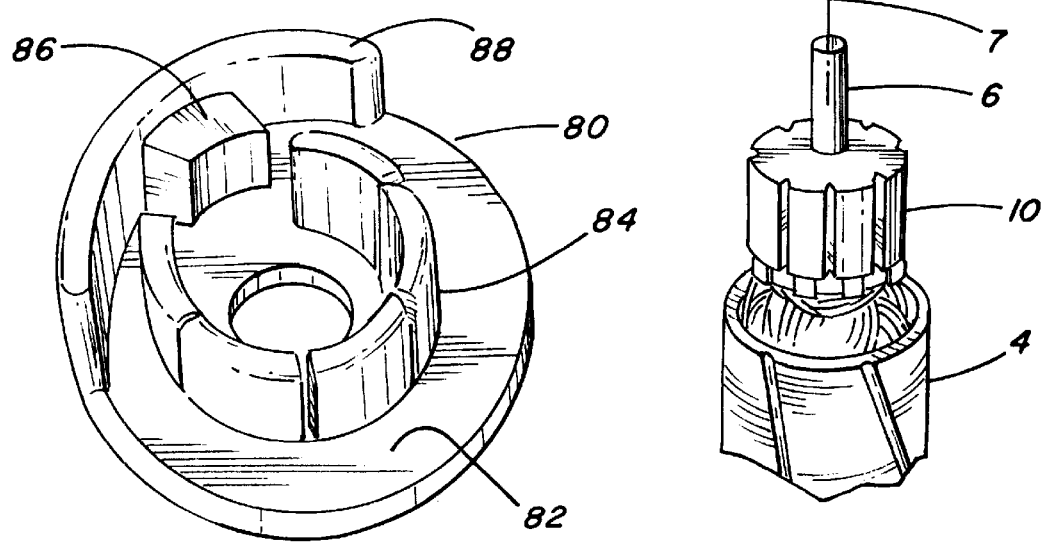
FIG. 5

LOW COST LIMITED ANGLE TORQUE DC BRUSHLESS SERVOMOTOR AND METHOD FOR FABRICATING THEREOF

BACKGROUND OF THE INVENTION

1. Field of the Invention

The present invention relates generally to brushless direct current (DC) motors and more particularly to a limited angle torque DC brushless motor for use in pneumatic servovalves and a variety of other applications.

2. Prior Art

Pneumatic servovalves are employed wherever there is a need for high-precision, closed loop motion control systems such as in automotive vehicle component testing and manufacturing, semiconductor manufacturing, packaging, equipment assembly, industrial automation and robotics, lumber processing and the like. Limited angle torque motors for use in pneumatic spool and sleeve servovalves usually comprise a DC brushless motor, a Hall sensor and an integrated controller. The limited angle torque motor drives the valve spool through an eccentric which is built into the motor shaft. Rotary operation of the motor shaft is translated into linear motion of the spool which modulates the gas flow through the control ports of the servovalve. The spool position is monitored by the Hall sensor with the controller comparing spool position with the valve input command. The resulting difference generates a current signal from the controller which drives the valve spool to the desired position.

Conventional DC brushless motors are widely used in limited angle torque applications and have satisfactory and reliable performance but are relatively expensive components for the servovalve manufacturer which is a major disadvantage as a significant portion of the retail cost of a pneumatic servovalve is directly related to the cost of the integrated DC brushless motor. DC brush motors, on the other hand, are relatively inexpensive but are never used in such applications as DC brush motors do not possess the high cycling and high frequency capability demanded by servomotors of this type. The problem lies in the commutator/brush interface with the brush/commutator connection becoming unreliable and impractical to use with high cycle and high frequency use. Carbon brushes typically tend to wear out quickly in high cycling and/or high frequency applications due to friction between the brushes and the commutator segments. Furthermore, brush control in high cycle limited angle torque applications is a major problem whereby complex and expensive controller circuitry may be needed to overcome the problem which, however, would further raise the cost of the servomotor and is undesirable. Therefore, the need arises for a low cost limited angle torque DC brushless servomotor which can provide reliable performance thereby presenting a viable alternative cost efficient solution for servovalve customers. Such a motor should preferably be easy to assemble in very short time and should be constructed from relatively inexpensive yet reliable components.

SUMMARY OF THE INVENTION

The present invention is directed to an improved limited angle torque DC brushless servomotor including a hollow cylindrical stator having embedded permanent magnets and a rotor having winding coils and commutator with a plurality of commutator segments mounted concentrically on a rotor shaft along the longitudinal rotor axis, the improvement comprising a bearing assembly mounted on the rotor shaft proximate to the commutator, a controller operatively associated with the rotor for rotating the rotor in a controlled limited angular fashion about the longitudinal rotor axis in response to an external rotor shaft angular displacement command signal, a sensor coupled to the bearing assembly for sensing the limited angular rotation of the rotor about the longitudinal rotor axis, the sensor producing a feedback signal representative of the rotor shaft angular displacement from a pre-determined rotor shaft angular displacement null position, and a circuit for electrically coupling the controller to the commutator and the sensor to the controller, the controller receiving and comparing the feedback signal with the external rotor shaft angular displacement command signal and generating a corresponding rotor motion control error signal, the controller communicating the rotor motion control error signal to the commutator to control the limited angular rotation of the rotor about the longitudinal rotor axis, the circuit having at least one portion flexing in consonance with the controlled limited angular rotation of the rotor about the longitudinal rotor axis during motor operation.

In accordance with one aspect of the present invention, the circuit is a flexible circuit having a plurality of flexible electrical conductors embedded between sheets of flexible insulating material. The flexible circuit comprises a generally L-shaped multiconductor body having a first multiconductor arm extending from one end of the body for removably coupling to the commutator and for flexing in consonance with the controlled limited angular rotation of the rotor about the longitudinal rotor axis and a second multiconductor arm extending upstream from the first multiconductor arm away from the L-shaped multiconductor body for coupling to the sensor, the L-shaped multiconductor body having its other end adapted for removably coupling to the controller. The controller is an electronic circuit board comprising at least a pulse width modulator integrated circuit (IC) chip. The circuit board further comprises a surface mounted flexible circuit connector for connecting to the other end of the L-shaped multiconductor body of the flexible circuit.

In accordance with another aspect of the present invention, the sensor comprises a surface mount Hall effect device for coupling to the mounted bearing assembly and a ring shaped permanent Hall magnet for coupling to the rotor shaft proximate to the Hall effect device. The ring-shaped permanent Hall magnet is fixed on the rotor shaft proximate to the surface mount Hall effect device. The surface mount Hall effect device measures variations in magnetic flux generated by the fixed Hall magnet as a result of angular displacement of the rotor shaft, the Hall effect device producing a corresponding feedback signal representative of the rotor shaft angular displacement from the pre-determined rotor shaft angular displacement null position.

In accordance with yet another aspect of the present invention, a method for improving the limited angle torque performance of a DC brush motor having a stator, brush assembly and a rotor, the rotor having winding coils and a commutator with commutator segments mounted concentrically on a rotor shaft along the longitudinal rotor axis is disclosed. The method comprises the steps of:

(a) providing a DC brush motor;

(b) removing the brush assembly from the DC brush motor;

(c) providing a bearing assembly having a bottom portion and a top portion;

(d) mounting the bearing assembly on the motor shaft proximate to the commutator, the bottom portion of the bearing assembly facing the commutator, the bearing assembly being stationary during motor operation;

(e) providing a surface mount Hall effect device;

(f) providing a permanent ring-shaped Hall magnet;

(g) mounting the permanent ring-shaped Hall magnet on the motor shaft proximate to the top portion of the bearing assembly;

(h) fixing the mounted Hall magnet to the rotor shaft;

(i) providing a controller for rotating the rotor in a controlled limited angular fashion about the longitudinal rotor axis;

(j) providing a flexible circuit including a substantially L-shaped multiconductor body having a first multiconductor arm extending from one end of the body for electrically coupling to the commutator and for flexing in consonance with the controlled limited angular rotation of the rotor about the longitudinal rotor axis, a second multiconductor arm extending upstream from the first multiconductor arm away from the L-shaped multiconductor body for electrically coupling to the Hall effect device, the other end of the L-shaped multiconductor body adapted for electrically coupling to the controller circuit board;

(k) removably coupling the other end of the L-shaped multiconductor body to the controller to establish electrical contact between the multiconductor body and the controller during motor operation, the controller having a flexible circuit connector for receiving the other end of the L-shaped multiconductor body;

(l) soldering the second arm to the surface mount Hall effect device to establish electrical contact between the second arm and the surface mount Hall effect device;

(m) adhesively attaching the soldered surface mount Hall effect device to the top portion of the bearing assembly proximate to the fixed Hall magnet to allow precision sensing of the angular displacement of the rotor shaft from a pre-determined rotor shaft angular displacement null position by the Hall effect device during motor operation;

(n) providing a snap-action retainer cap for removably coupling said first multiconductor arm to the commutator; and (o) coupling said first multiconductor arm to the commutator with said snap-action retainer cap to establish electrical contact between said first multiconductor arm and the commutator so as to allow said controller to control the limited angular rotation of the rotor about the longitudinal rotor axis, said coupling allowing a portion of said first multiconductor arm to flex in consonance with the controlled limited angular rotation of the rotor about the longitudinal rotor axis during motor operation.

The present invention is also directed to a rotor limited angle torque motion control system for use with a DC motor including a hollow cylindrical stator having embedded permanent magnets and a rotor having winding coils and commutator with a plurality of commutator segments mounted concentrically on a rotor shaft along the longitudinal rotor axis, the rotor limited angle torque motion control system comprising a bearing assembly mounted on the rotor shaft proximate to the commutator, a controller operatively associated with the rotor for rotating the rotor in a controlled limited angular fashion about the longitudinal rotor axis in response to an external rotor shaft angular displacement command signal, a sensor coupled to the bearing assembly for sensing the limited angular rotation of the rotor about the longitudinal rotor axis, the sensor producing a feedback signal representative of the rotor shaft angular displacement from a predetermined rotor shaft angular displacement null position, and a circuit for electrically coupling the controller to the commutator and the sensor to the controller, the controller receiving and comparing the feedback signal with the external rotor shaft angular displacement command signal and generating a corresponding rotor motion control error signal, the controller communicating the rotor motion control error signal to the commutator to control the limited angular rotation of the rotor about the longitudinal rotor axis, the circuit having at least one portion flexing in consonance with the controlled limited angular rotation of the rotor about the longitudinal rotor axis during motor operation.

These and other aspects of the present invention will become apparent from a review of the accompanying drawings and the following detailed description of the invention.

BRIEF DESCRIPTION OF THE DRAWINGS

FIG. 1 is a side perspective view of a limited angle torque DC brushless servomotor (without the stator) in accordance with the present invention;

FIG. 2 is a front perspective view of the motor of FIG. 1;

FIG. 3 is a plan view of a flexible circuit used in the motor of FIG. 1 in accordance with the present invention;

FIG. 4 is a perspective view of the motor of FIG. 1 being assembled in accordance with the present invention FIG. 5 is a perspective view of a plastic retainer cap used in the motor assembly of FIG. 4;

DETAILED DESCRIPTION OF THE PREFERRED EMBODIMENTS

Hereinafter, some preferred embodiments of the present invention will be described in detail with reference to the related drawings of FIGS. 1–8. Additional embodiments, features and/or advantages of the invention will become apparent from the ensuing description or may be learned by the practice of the invention.

The following description includes the best mode presently contemplated for carrying out the invention. This description is not to be taken in a limiting sense, but is made merely for the purpose of describing the general principles of the invention.

The present invention refers to a low cost limited angle torque DC brushless servomotor which can be constructed from a modified standard low cost two-pole DC brush motor having a rotor and a stator, a rotor motion controller, an inexpensive flexible electroconductive circuit, a low cost magnetic rotor shaft angular displacement sensor and suitable support structure such as a bearing assembly. The stator is a standard hollow cylindrical body with permanent magnets embedded on its inner side. The rotor has conventional coils wound on a rotor shaft and a commutator with a number of commutator segments mounted concentrically along the longitudinal rotor shaft.

The standard two-pole DC brush motor is modified by removing the brush assembly and substituting in its place an appropriately configured multiconductor flexible circuit which is coupled between the controller, commutator and sensor. The flexible circuit provides a conduit for electrical communication between the controller and the rotor via the commutator and a conduit for electrical communication between the sensor and the controller. Part of the circuit is supported between the assembly and the commutator and flexes in consonance with the controlled limited angular rotation of the rotor without affecting performance or reliability of the motor. The rest of the circuit and the bearing assembly remain stationary during motor operation. The bearing assembly supports the sensor and is used to mount the motor in a housing for a pneumatic servovalve or the like. The sensor comprises a conventional surface mount Hall effect device which on one side is soldered directly to a portion of the flexible circuit and on the other side is glued to the bearing assembly in proximity to a permanent ring-shaped Hall magnet which is fixed concentrically on the rotor shaft. The sensor provides a feedback signal to the controller regarding the actual angular rotor shaft displacement from a pre-determined rotor shaft null position. The controller compares the feedback signal to an external command signal and drives the rotor (and spool if it is a pneumatic servovalve application) to the commanded position when it detects an error via the flexible circuit. Therefore, the controller, sensor and flexible circuit function as a closed loop feedback control system driving the rotor via the commutator during operation of the servomotor.

Figure 8:
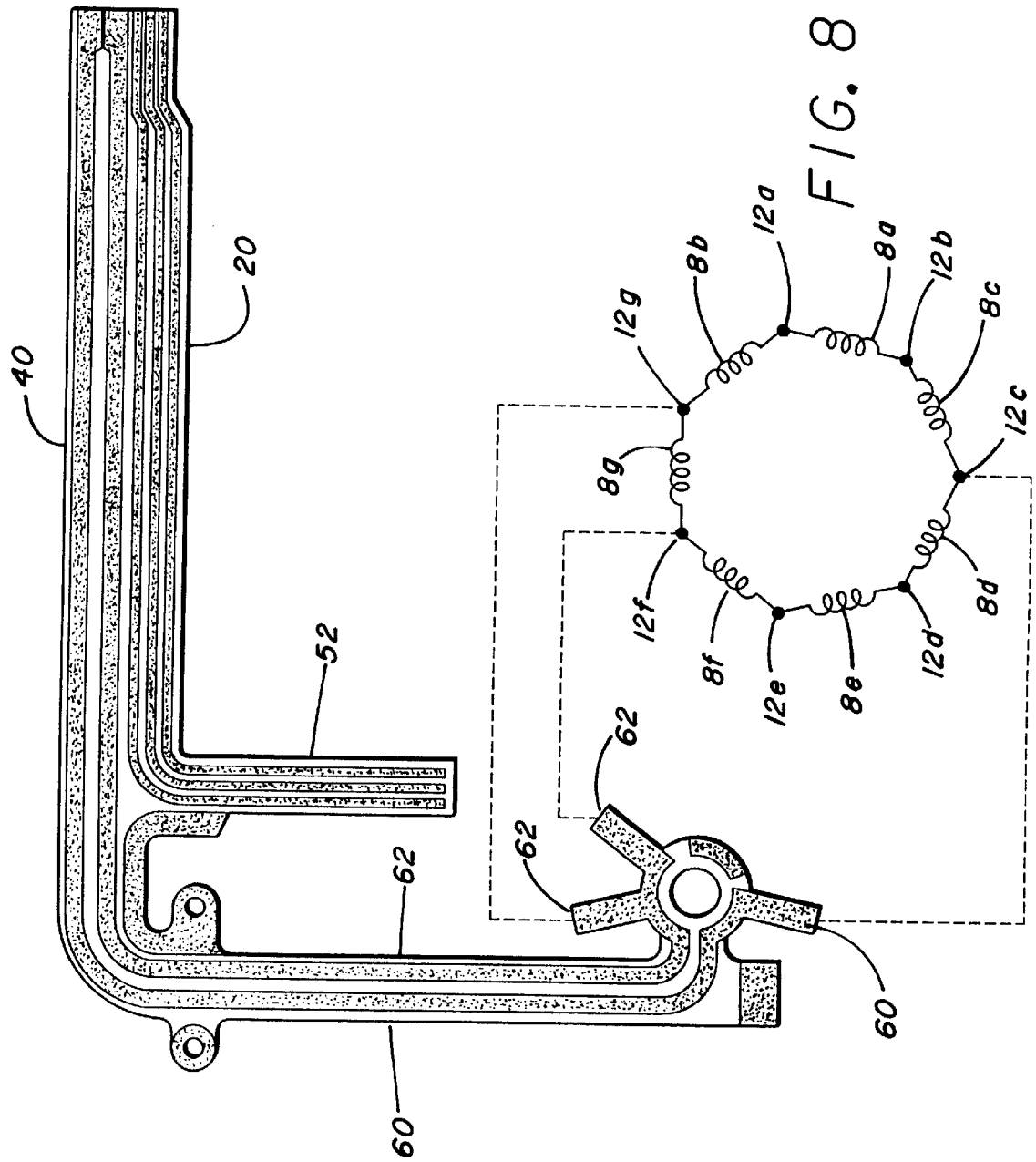
FIG. 8 is a circuit diagram showing the electrical connection between the flexible circuit and the commutator segments of the motor of FIG. 1 in accordance with the present invention.

Referring now more particularly to FIGS. 1–4, an improved limited angle torque DC brushless servomotor, generally referred to by reference numeral 2, is shown for use preferably in a pneumatic direct drive servovalve in accordance with the principles of the present invention. A pneumatic direct drive servovalve includes a valve housing within which there is disposed a spool and sleeve assembly (not shown). Limited angle torque servomotor 2 is positioned in the upper half of the valve housing (not shown). Servomotor 2 includes a rotor 4 from a standard low cost DC brush motor which is provided with a shaft 6 (FIG. 4) extending concentrically therefrom. Rotor 4 has a number of coils 8 wound on shaft 6 in a conventional fashion and a commutator 10 comprised of a number of commutator segments 12 mounted concentrically on shaft 6 (FIG. 1) and insulated from each other. Each coil is connected to a neighboring coil via a metal commutator segment as shown in FIG. 8. For example, coil 8a is electrically connected to coil 8b via commutator segment 12a, coil 8c is electrically connected to coil 8d via commutator segment 12c and so forth. Attached on the other (valve) side of shaft 6 is an eccentric which has a drive ball for engaging an opening provided in the spool (not shown). Upon angular reciprocation of shaft 6 about a rotor longitudinal axis 7 (FIG. 4), the drive ball moves back and forth about the axis which causes the spool to reciprocate within a bore provided in the valve housing translating rotor shaft rotation (about axis 7) into linear spool displacement to modulate air flow through the servovalve control ports.

Servomotor 2 is also provided with a stator (not shown) from a standard low cost two-pole DC brush motor with the brush assembly removed. The brush assembly is removed to overcome the problems associated with using brushes in high cycling/high frequency limited torque angle applications as described herein above. A stator of this type has a hollow cylindrical body with permanent magnets embedded in its interior surface. The rotor with the coil windings is inserted concentrically inside the stator whereby a relatively small air gap is provided between the coil windings and the permanent magnets on the stator. The outer surface of the stator is adhesively attached to the inside wall of the valve housing. Usually an index notch in both the stator and the valve housing is provided to physically align the magnetic poles of the stator relative to the housing.

As shown in FIG. 1, servomotor 2 is further provided with an upper bearing assembly 14 mounted concentrically on shaft 6 above commutator 10 and made preferably of metal. Another lower bearing assembly is provided on the other (valve) side of shaft 6 (not shown) comprising a bearing mounted on top of the eccentric. Bearing assembly 14 supports rotor 4 inside the valve housing and has several mechanical components. Specifically, bearing assembly 14 has a top portion 14a and a bottom portion 14b. Bottom portion 14b faces commutator 10 and includes a bearing 16, which allows free rotation of the rotor about axis 7 inside the bearing, a shim and a bearing pre-load spring (not shown). Top portion 14a includes a bearing hub 17 generally in the shape of a hat (FIGS. 1–2). Bearing hub 17 and bearing 16 are connected preferably via a sliding fit type of connection whereby the spring creates a force, or pre-load, between the bearing hub 17 and bearing 16 which forces the rotor 6 at the lower bearing against a shoulder in the lower bearing bore of the valve body in order to eliminate any axial play due to tolerances out of the assembly (not shown). A bearing is required on each end of shaft 6 to allow rotation of the rotor about axis 7. Bearing assembly 14 secures the motor inside the valve housing via bearing hub 17 which is secured to the valve housing preferably by adhesive and screws and is therefore stationary during motor operation.

The other function of bearing assembly 14, in accordance with the best mode for practicing the present invention, is to provide support for a conventional multiconductor flexible circuit 20 (FIGS. 1–2) which contains a number of flexible copper conductors or traces 21 embedded between sheets of flexible insulating plastic. As illustrated in FIG. 1, flexible circuit 20 (which is shown in this Figure in a free-standing non-operational state) substitutes for the removed brush assembly and provides electrical communication between commutator 10 of rotor 4, a controller 22 (FIG. 1) and a rotor shaft angular displacement sensor 24 during motor operation. One end of flexible circuit 20 is attached to commutator 10 and flexes (FIG. 7) as the rotor shaft rotates about axis 7 in a limited angular fashion. A middle extension of flexible circuit 20 is attached to sensor 24 and the other end is connected to controller 22. The middle extension and the other end of the flexible circuit although capable of flexing preferably remain stationary during motor operation. Flexible circuits of this type may be custom-made relatively inexpensively by electronics manufacturers throughout the country and are used in various configurations in a variety of applications such as computer hard drives, scanners, printers and the like. For example, the flexible circuit depicted in FIG. 3 was custom-made for the purpose of testing the present invention in a specific configuration by World Circuit Technology of Simi Valley, Calif. Other flexible circuit configurations may be employed depending on the intended application.

Sensor 24 comprises a conventional surface mount Hall effect device (Hall sensor) 26 which has three contact pads on its top surface (not shown)—two of the pads for power and one pad for feedback. Hall sensor 26 is intended to be affixed in a recess 28 in the top portion of bearing hub 17 adjacent to a permanent ring-shaped Hall magnet 30 which is adhesively mounted concentrically on shaft 6. Ring-shaped Hall magnet 30 has an inner diameter slightly larger than the diameter of rotor shaft 6 and an outer diameter smaller than the diameter of the top portion of bearing hub 17 which is circular and has a hollow interior to accommodate adhesively mounted Hall magnet 30 (FIG. 2). An annular spacing 32 is thus created between the outer edge of the mounted Hall magnet 30 and the interior surface of the hollow top portion of bearing hub 17 to allow free rotation of Hall magnet 30 within bearing hub 17. Hall sensors are relatively inexpensive components and are widely available commercially. Hall sensor 26 is stationary during motor operation and is used to measure variations in magnetic flux generated by rotating Hall magnet 30 which rotates with the rotor shaft about axis 7. Hall sensor 26 outputs a corresponding analog voltage signal which is passed on to controller 22 via the flexible circuit and serves as feedback on actual rotor shaft angular displacement. As shaft 6 rotates in a limited angular fashion about axis 7, feedback voltage varies sinusoidally relative to rotor shaft angle of displacement from a pre-determined rotor shaft angular null position. As an example, a typical operational range of angular displacement of rotor 6 about axis 7 would be (−30 degrees, 30 degrees). In such a case, the steepest and approximately linear portion of the curve for a plot of feedback voltage versus angular displacement would occur in the (−5 V, 5V) range. The (−5 V, 5V) range is a preferred sensing range as it provides the most accurate sensing of the angular displacement of rotor shaft 6 during motor operation.

As shown in FIG. 1, controller 22 is a conventional and relatively inexpensive custom-made control circuit board which incorporates a pulse width modulator IC chip (not shown) which pulses the rotor 6 depending on the amount of torque needed. In the servovalve application, the control circuit board rests in a cavity on top of the valve (not shown). A gasket is used between the valve housing and the valve cover to seal the cavity in which the circuit board lies. Controller 22 is also provided with a flexible circuit connector 24 for mating with one end of flexible circuit 20. The circuit board used in the present invention was made, for example, by the assignee of the instant patent application. The operation is in closed loop feedback mode with controller 22 receiving a rotor shaft angular displacement input command signal (voltage) from an external source which is compared with the feedback voltage signal received from Hall sensor 26. The feedback voltage signal represents actual angular displacement of the rotor shaft from a pre-determined rotor shaft angular null position, which in the servovalve application case would correspond to zero gas flow. If an error is detected, controller 22 sends an appropriate control signal to rotor 6 via flexible circuit 20 to move to the desired (commanded) angular displacement position.

In accordance with another preferred embodiment of the present invention, controller 22, flexible circuit 20 and sensor 24 function as an automatic rotor limited angle torque motion control system having closed loop feedback which drives the rotor shaft 6 in a limited angular fashion about axis 7 in accordance with a series of rotor angular displacement command signals from an external source. Controller 22 is powered by a regulated DC voltage power supply (not shown).

Closed loop connectivity is provided by flexible circuit 20 which, in one preferred embodiment of the present invention, as shown in FIG. 3, comprises an approximately L-shaped multiconductor body 40 having a first multiconductor arm 42 extending from one end of body 40. Arm 42 includes a hand portion 44 which has in turn a palm portion 46 and three electrically conductive fingers 48, 50 and 52 for establishing electrical contact with some of the commutator segments 12. Fingers 48, 50 and 52 are preferably spaced apart in a configuration which allows controller 22 to communicate with rotor 6 via commutator 10 when the fingers are in electrical contact with some of the commutator segments 12. Palm portion 46 is generally shaped like a ring for removably mounting concentrically on rotor shaft 6 with the ring having an inner diameter larger than the diameter of shaft 6 for accommodating the same. Each finger includes an end portion preferably having a band of exposed copper covered with a thin layer of lead-tin solder alloy on the back (not shown) for conducting current to a single commutator segment. Specifically, arm 42 includes two copper traces 60 and 62 (FIG. 3) which carry current from controller 22 and make electrical contact with commutator segments 12c, 12f and 12g respectively (FIG. 8) so as to create two active electrical circuits which cover coils 8f, 8e, 8d and 8b, 8a and 8c, respectively, leaving coil 8g inactive during motor operation. There is no switching of coils as in the brush case during operation of the servomotor with the back and forth angular rotation of rotor shaft 6 directed by controller 22 in response to external input command signals. The preferred operational voltage range in this regard is (−24V, 24V).

Hand portion 44 is removably mounted over commutator 10 preferably via a plastic snap-action retainer cap 80 (FIGS. 4–5) which includes a ring-shaped base 82 for removably mounting concentrically on rotor shaft 6. Ring-shaped base 82 preferably has an inner diameter larger than the diameter of the rotor shaft for accommodating the same. Retainer cap 80 is also provided with a semi-circular inner wall 84 recessed inwardly and emanating from base 82 for frictionally securing the exposed copper end portions of fingers 48, 50 and 52 against corresponding commutator segments so that copper traces 60 and 62 are in electrical contact with commutator segments 12c, 12f and 12g during motor operation. Retainer cap 80 also includes a semi-circular back wall 88 emanating from the edge of base 82 which has a tooth 86 protruding outward in a direction normal to axis 7 opposite wall 84 for providing additional mounting (frictional) support to hand portion 44 during motor operation.

It should be appreciated by a person skilled in that art that the above connection may be alternatively made by soldering or adhesively bonding the exposed copper portions of fingers 48, 50 and 52 via connecting wires to respective commutator segments. However, such connection is not preferred as wires would typically experience fatigue and may break relatively quickly from the high cycling back and forth movement of the rotor shaft. Furthermore, bonding wires are generally stiffer than a flex circuit connection which would generate additional position errors between the command signal and the feedback signal from Hall sensor 26. Also, assembly time with the flexible circuit is greatly reduced compared to soldering wires to commutator segments which have a relatively large amount of mass and require substantial heating to bring the commutator segment surface to soldering temperature. Moreover, heating of commutator segments runs the risk of damaging the bond between the commutator segment and the insulating material on which it is secured. The flexible circuit/commutator connection is therefore preferred in accordance with the best mode for practicing the present invention as it provides quick assembly time, reliable electrical connection and imparts no significant moment (force) on the rotor.

Figure 6:
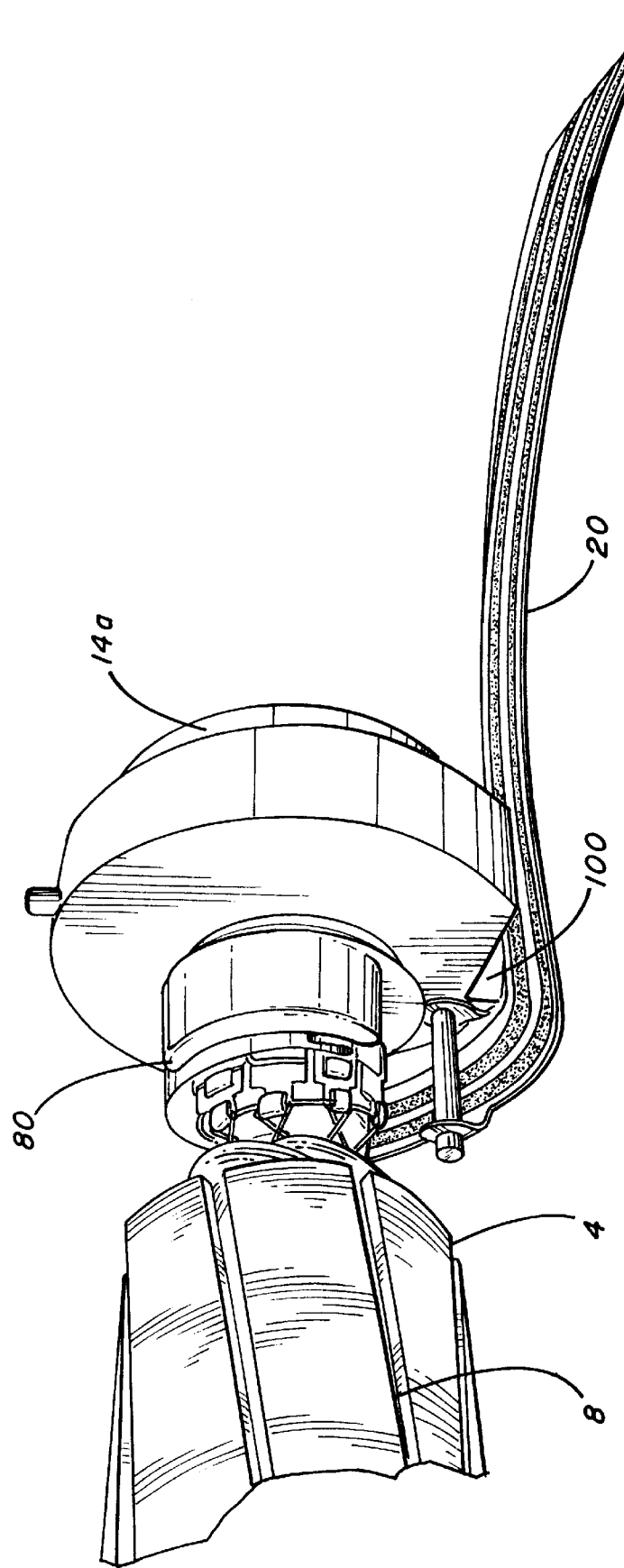
FIG. 6 is a side perspective view of the motor of FIG. 1 with the rotor shaft in the null position in accordance with the present invention.

As the servomotor is being assembled for use in the pneumatic servovalve application in accordance with the principles of the present invention, calibration (or orientation) of fingers 48, 50, 52 relative to the commutator segments should be carried out. Specifically, as shown in FIG. 3, an imaginary line 90 bisecting the arc-like portion of space between fingers 48 and 50 should be drawn to coincide with the axis of the eccentric drive ball. The null position is thus defined by the bisecting line coinciding with the eccentric drive ball axis. This position is also defined, as mentioned above, as the position of zero gas flow. A null position of rotor shaft 6 is depicted in FIG. 6.

Flexible circuit body 40 also includes a second multiconductor arm 52 which has an end portion 54 that also has bands of exposed copper each covered with a thin layer of lead-tin solder alloy on the back (not shown) for attaching to and conducting current to Hall sensor 26. Each band of exposed copper corresponds to a particular copper trace running in the arm.

In accordance with yet another preferred embodiment of the present invention, the exposed copper portion of second arm 52 is soldered directly to the top of surface mount Hall sensor 26 using a standard lead-tin solder alloy. Specifically, arm 52 includes three copper traces 56, 57 and 58 (FIG. 3) which connect respectively to the above-described three top contact pads of surface mount Hall sensor 26. Trace 58 is preferably dedicated to carrying the rotor shaft angular displacement position feedback signal to controller 22, while traces 56 and 57 carry current supplied by controller 22. The preferred power range, as mentioned above, is (−5V, 5V).

It should be appreciated by a person skilled in the art that such connection greatly reduces assembly time and at the same provides a reliable electrical connection for the Hall sensor. The soldered Hall sensor is then adhesively attached in recess 28 as depicted in FIG. 2.

The other end of flexible circuit body 40 has a terminal portion 70 which is also provided on the back side (not shown) with bands of exposed copper each band covered with a thin layer of lead-tin solder alloy and corresponding to a particular copper trace running in this portion of the flexible circuit for mating with flexible circuit connector 24 (FIG. 1). Terminal portion 70 carries all five traces to connector 24 closing the electrical connectivity loop.

Flexible circuit body 40 is further provided with a pair of ring-shaped anti-stress tabs 72 and 74, respectively, (FIG. 3) which are inserted in an anti-stress pin 76 which extends outwardly parallel to axis 7 from the bottom portion of bearing 16. Tabs 72 and 74 are disposed in such a way from hand portion 44 so as to allow the portion of flexible circuit mounted between the pin connection and the commutator connection to be capable of flexing in consonance with the limited angle torque motion of rotor 6 without impacting performance or reliability of the motor with the rest of the flexible circuit remaining stationary during motor operation. Furthermore, bearing assembly 14 is provided with a side cutout 100 (FIG. 1) to provide mounting support for the portion of flexible circuit body between the first and second arm.

Since flexible circuit 20 is covered with thin sheets of plastic, a certain amount of extra copper is embedded between the sheets in designated areas around the circuit body, such as areas 102, 103, 104 and 105, to provide extra structural strength as shown in FIG. 3. Moreover, strain relief areas (not shown) are provided in critical areas by packing extra plastic material, such as for example around the curve of hand portion 44 and in the area between tabs 72 and 74.

Figure 7:
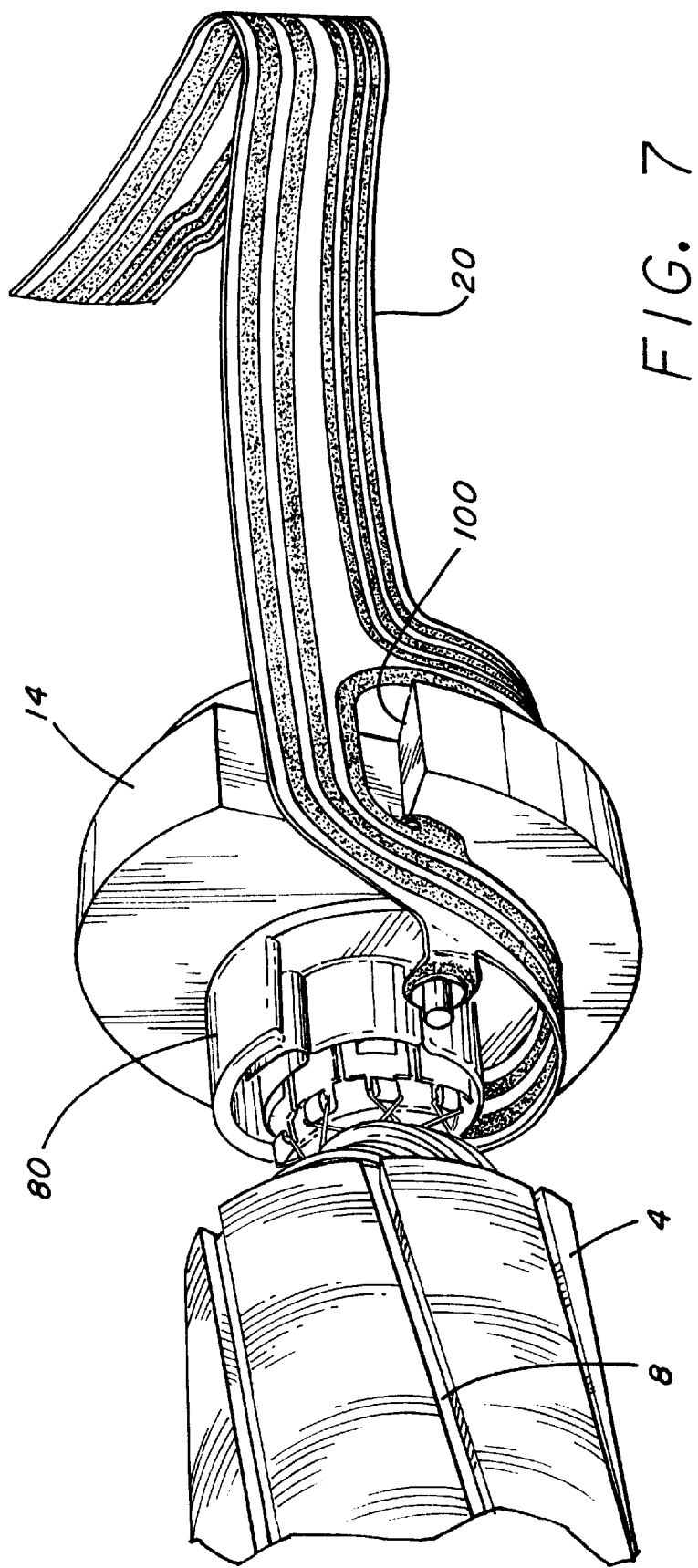
FIG. 7 is a side perspective view of the motor of FIG. 6 during operation with the rotor shaft in a position offset from the null position in accordance with the present invention.

The above-described improved limited angle torque servomotor is capable of high operational cycling typically up to 30 million cycles and frequency range of 40 Hz–100 Hz, wherein one cycle could start, for example from 10 degrees then rotate to 30 degrees and then rotate back to 10 degrees. The preferred operational range of the inventive servomotor in the servovalve application is (−30 degrees, 30 degrees) whereby 30 degrees would be defined as full gas flow to one end of the servovalve cylinder and −30 degrees would be defined as full gas flow to the other end of the cylinder. Any angle of rotation of the rotor shaft 6 in between these optimal values would be defined as partial flow in the respective direction. Such a rotor shaft displacement is shown in FIG. 7.

It is worth noting that servomotor 2 can be operated optimally in the servovalve application in the range of (−40 degrees, 40 degrees) with each of the optimal values corresponding to an actual mechanical stop provided by a sleeve plug on each side of the sleeve.

In accordance with another preferred embodiment of the present invention, a method for improving the limited angle torque performance of a standard DC brush motor is disclosed. The standard DC motor has a stator, brush assembly and a rotor with the rotor having winding coils and a commutator with commutator segments mounted concentrically on a rotor shaft along the longitudinal rotor axis is disclosed. The method comprises the following steps:

(1) providing a DC brush motor;
(2) removing the brush assembly from the DC brush motor;
(3) providing a bearing assembly having a bottom portion and a top portion;
(4) mounting the bearing assembly on the motor shaft proximate to the commutator, the bottom portion of the bearing assembly facing the commutator, the bearing assembly being stationary during motor operation;
(5) providing a surface mount Hall effect device;
(6) providing a permanent ring-shaped Hall magnet;
(7) mounting the permanent ring-shaped Hall magnet on the motor shaft proximate to the top portion of the bearing assembly;
(8) adhesively fixing the mounted Hall magnet to the rotor shaft;
(9) providing a controller for rotating the rotor in a controlled limited angular fashion about the longitudinal rotor axis;
(10) providing a flexible circuit including a substantially L-shaped multiconductor body having a first multiconductor arm extending from one end of the body for electrically coupling to the commutator and for flexing in consonance with the controlled limited angular rotation of the rotor about the longitudinal rotor axis, a second multiconductor arm extending upstream from the first multiconductor arm away from the L-shaped multiconductor body for electrically coupling to the Hall effect device, the other end of the L-shaped multiconductor body adapted for electrically coupling to the controller circuit board;
(11) removably coupling the other end of the L-shaped multiconductor body to the controller to establish electrical contact between the multiconductor body and the controller during motor operation, the controller having a flexible circuit connector for receiving the other end of the L-shaped multiconductor body;
(12) soldering the second arm to the surface mount Hall effect device to establish electrical contact between the second arm and the surface mount Hall effect device;

(13) adhesively attaching the soldered surface mount Hall effect device to the top portion of the bearing assembly proximate to the fixed Hall magnet to allow precision sensing of the angular displacement of the rotor shaft from a pre-determined rotor shaft angular displacement null position by the Hall effect device during motor operation;

(14) providing a snap-action retainer cap for removably coupling said first multiconductor arm to the commutator; and

(15) coupling said first multiconductor arm to the commutator with said snap-action retainer cap to establish electrical contact between said first multiconductor arm and the commutator so as to allow said controller to control the limited angular rotation of the rotor about the longitudinal rotor axis, said coupling allowing a portion of said first multiconductor arm to flex in consonance with the controlled limited angular rotation of the rotor about the longitudinal rotor axis during motor operation.

If the servomotor is used in the direct drive pneumatic servovalve application, an additional method step would be needed. The additional step would be calibrating the rotor shaft angular null position as described hereinabove. It should be appreciated by a person skilled in the art that the novel limited angle torque DC brushless servomotor may be used not only in servovalves but in a variety of other applications providing such applications do not depart from the intended purpose of the present invention.

The above-described inventive servomotor can be constructed from low cost yet reliable components, is easy to assemble in a matter of seconds and provides reliable limited angle torque performance matching the performance of conventional DC brushless servomotors at a cost differential of about 10:1.

While the present invention has been described in detail with regards to the preferred embodiments, it should be appreciated that various modifications and variations may be made in the present invention without departing from the scope or spirit of the invention. For example, it may be possible to modify the novel servomotor in the pneumatic servovalve application so as to integrate the inventive upper bearing assembly in an appropriate location inside the servovalve housing. In such a case the Hall sensor would be permanently attached outside of the servomotor on the integrated upper bearing assembly adjacent the Hall magnet which would remain part of the servomotor assembly. Such a set up would reduce the number of parts required to assemble the servomotor and would alter the manner of fabricating the servomotor with the rotor being mounted in the integrated (in the valve housing) upper bearing assembly, the Hall magnet being mounted on the shaft thereafter in the hollow top portion of the bearing hub which is part of the integrated bearing assembly adjacent the Hall sensor with the flex circuit and controller board assembled in the manner described herein above. Furthermore, the present invention is not limited to using a Hall sensor/Hall magnet pair for sensing angular displacement of the rotor shaft from a pre-determined rotary shaft null position. Other types of sensors may be used to sense angular displacement of the rotor shaft from the null position during operation of the servomotor provided that the use of such sensors does not depart from the intended purpose of the present invention.

It should be appreciated by a person skilled in the art that features illustrated or described as part of one embodiment can be used in another embodiment to provide yet another embodiment such that the features are not limited to the specific embodiments described above. Thus, it is intended that the present invention cover such modifications, embodiments and variations as long as they come within the scope of the appended claims and their equivalents.

What is claimed is:

1. An improved limited angle torque DC brushless servomotor for mounting in a housing adapted for receiving and supporting the servomotor, the servomotor including a hollow cylindrical stator having embedded permanent magnets and a rotor having winding coils and commutator with a plurality of commutator segments mounted concentrically on a rotor shaft along the longitudinal rotor axis, the improvement comprising:

a controller operatively associated with the rotor for rotating the rotor in a controlled limited angular fashion about the longitudinal rotor axis in response to an external rotor shaft angular displacement command signal;

a sensor coupled to the housing for sensing the limited angular rotation of the rotor about the longitudinal rotor axis, said sensor producing a feedback signal representative of the rotor shaft angular displacement from a predetermined rotor shaft angular null position; and a circuit for electrically coupling said controller to the commutator and said sensor to said controller, said controller receiving and comparing said feedback signal with said external rotor shaft angular displacement command signal and generating a corresponding rotor motion control error signal, said controller communicating said rotor motion control error signal to the commutator to control the limited angular rotation of the rotor about the longitudinal rotor axis, said circuit having at least one portion flexing in consonance with the controlled limited angular rotation of the rotor about the longitudinal rotor axis during motor operation.

2. An improved limited angle torque DC brushless servomotor including a hollow cylindrical stator having embedded permanent magnets and a rotor having winding coils and commutator with a plurality of commutator segments mounted concentrically on a rotor shaft along the longitudinal rotor axis, the improvement comprising:

a bearing assembly mounted on the rotor shaft proximate to the commutator;

a controller operatively associated with the rotor for rotating the rotor in a controlled limited angular fashion about the longitudinal rotor axis in response to an external rotor shaft angular displacement command signal;

a sensor coupled to said bearing assembly for sensing the limited angular rotation of the rotor about the longitudinal rotor axis, said sensor producing a feedback signal representative of the rotor shaft angular displacement from a pre-determined rotor shaft angular null position; and a circuit for electrically coupling said controller to the commutator and said sensor to said controller, said controller receiving and comparing said feedback signal with said external rotor shaft angular displacement command signal and generating a corresponding rotor motion control error signal, said controller communicating said rotor motion control error signal to the commutator to control the limited angular rotation of the rotor about the longitudinal rotor axis, said circuit having at least one portion flexing in consonance with the controlled limited angular rotation of the rotor about the longitudinal rotor axis during motor operation.

3. The improved limited angle torque DC brushless servomotor of claim 2, wherein said circuit is a flexible circuit having a plurality of flexible electrical conductors embedded between sheets of flexible insulating material.

4. The improved limited angle torque DC brushless servomotor of claim 3, wherein said flexible circuit comprises a plurality of multiconductor arms for coupling to the commutator and to said sensor, at least one of said multiconductor arms flexing in consonance with the controlled limited angular rotation of the rotor about the longitudinal rotor axis.

5. The improved limited angle torque DC brushless servomotor of claim 3, wherein said flexible circuit comprises a substantially L-shaped multiconductor body having a first multiconductor arm extending from one end of said body for removably coupling to the commutator and for flexing in consonance with the controlled limited angular rotation of the rotor about the longitudinal rotor axis and a second multiconductor arm extending upstream from said first multiconductor arm away from said L-shaped multiconductor body for coupling to said sensor, said L-shaped multiconductor body having its other end adapted for removably coupling to said controller.

6. The improved limited angle torque DC brushless servomotor of claim 5, wherein said first multiconductor arm of said flexible circuit includes a hand portion having a palm and a plurality of electrically conductive fingers for establishing electrical contact with some of the commutator segments, said fingers spaced apart in a configuration allowing said controller to communicate with the rotor when said fingers are in electrical contact with some of the commutator segments.

7. The improved limited angle torque DC brushless servomotor of claim 6, wherein said palm is substantially shaped like a ring for mounting concentrically on the rotor shaft, said ring having an inner diameter larger than the diameter of the rotor shaft for accommodating the rotor shaft.

8. The improved limited angle torque DC brushless servomotor of claim 7, wherein each of said fingers includes an end portion adapted for conducting current to a single commutator segment.

9. The improved limited angle torque DC brushless servomotor of claim 8, further comprising means for coupling said hand portion to the commutator.

10. The improved limited angle torque DC brushless servomotor of claim 9, wherein said coupling means includes a snap-action retainer for fixing said hand portion to said commutator, wherein said fingers of said hand portion are in electrical contact with some of the commutator segments under said retainer allowing said controller to control the limited angular rotation of the rotor about the longitudinal rotor axis du ring motor operation.

11. The improved limited angle torque DC brushless servomotor of claim 10, wherein said snap-action retainer is substantially shaped like a cap including a ring-shaped base for mounting concentrically on the rotor shaft, said ring-shaped base having an inner diameter larger than the diameter of the rotor shaft for accommodating the rotor shaft.

12. The improved limited angle torque DC brushless servomotor of claim 11, wherein said snap-action retainer cap further includes a plurality of inner walls recessed inwardly and emanating from said ring-shaped base for securing said electroconductive end portions of said fingers against respective commutator segments.

13. The improved limited angle torque DC brushless servomotor of claim 2, wherein said mounted bearing assembly has a top portion and a bottom portion, said bottom portion facing the commutator.

14. The improved limited angle torque DC brushless servomotor of claim 13, wherein said sensor comprises a Hall effect device for coupling to said top portion of said mounted bearing assembly and a Hall magnet for coupling to the rotor shaft proximate to said Hall effect device.

15. The improved limited angle torque DC brushless servomotor of claim 14, wherein said Hall effect device is a surface mount Hall effect device.

16. The improved limited angle torque DC brushless servomotor of claim 15, wherein said Hall magnet is a permanent magnet shaped substantially like a ring for mounting on the rotor shaft, said ring having an inner diameter larger than the diameter of the rotor shaft for accommodating the rotor shaft.

17. The improved limited angle torque DC brushless servomotor of claim 16 wherein said ring-shaped permanent Hall magnet is fixed on the rotor shaft proximate to said surface mount Hall effect device, said surface mount Hall effect device measuring variations in magnetic flux generated by said fixed Hall magnet as a result of angular displacement of the rotor shaft, said Hall effect device producing a corresponding feedback signal representative of the rotor shaft angular displacement from said predetermined rotor shaft angular null position.

18. The improved limit ed angle torque DC brushless servomotor of claim 17 wherein said circuit is a flexible circuit comprising a substantially L-shaped multiconductor body having a first multiconductor arm and a second multiconductor arm, said second multiconductor arm includes an end portion adapted for electrically coupling to said surface mount Hall effect devices.

19. The improved limited angle torque DC brushless servomotor of claim 18 further comprising means for coupling said adapted end portion of said second multiconductor arm to said surface mount Hall effect device.

20. The improved angle torque DC brushless servomotor of claim 19, wherein said coupling means includes soldering said adapted end portion of said second arm directly to said surface mount Hall effect device.

21. The improved limited angle torque DC brushless servomotor of claim 20, further comprising means for coupling said soldered surface mount Hall effect device to said top portion of said bearing assembly.

22. The improved limited angle torque DC brushless servomotor of claim 21, wherein said coupling means comprises a recess provided in said top portion of said bearing assembly for accommodating said soldered surface mount Hall effect device, said soldered surface mount Hall effect device adhesively attached to the bottom of said recess.

23. The improved limited angle torque DC brushless servomotor of claim 22, wherein said controller is an electronic circuit board comprising at least a pulse width modulator integrated circuit (IC) chip.

24. The improved limited angle torque DC brushless servomotor of claim 23, wherein said circuit board further comprises a surface mounted flexible circuit connector for connecting to said end portion of said L-shaped multiconductor body of said flexible circuit.

25. The improved limited angle torque DC brushless servomotor of claim 24, wherein said end portion of said L-shaped multiconductor body of said flexible circuit has an electroconductive portion adapted for mating with said surface mounted flexible circuit connector.

26. The improved limited angle torque DC brushless servomotor of claim 18, wherein said bottom portion of said bearing assembly is provided with a cutout for accommodating a portion of said L-shaped multiconductor body, said portion being between said first multiconductor arm and said second multiconductor arm.

27. A method for improving the limited angle torque performance of a DC brush motor having a stator, brush assembly and a rotor, the rotor having winding coils and a commutator with commutator segments mounted concentrically on a rotor shaft along the longitudinal rotor axis, the method comprising the steps of:

providing a DC brush motor;

removing the brush assembly from said DC brush motor;

providing a bearing assembly having a bottom portion and a top portion;

mounting said bearing assembly on the motor shaft proximate to the commutator, said bottom portion of said bearing assembly facing the commutator, said bearing assembly being stationary during motor operation;

providing a surface mount Hall effect device;

providing a permanent ring-shaped Hall magnet;

mounting said permanent ring-shaped Hall magnet on the motor shaft proximate to said top portion of said bearing assembly;

adhesively fixing said mounted Hall magnet to the rotor shaft;

providing a controller for rotating the rotor in a controlled limited angular fashion about the longitudinal rotor axis;

providing a flexible circuit including a substantially L-shaped multiconductor body having a first multiconductor arm extending from one end of said body for electrically coupling to the commutator and for flexing in consonance with the controlled limited angular rotation of the rotor about the longitudinal rotor axis, a second multiconductor arm extending upstream from said first multiconductor arm away from said L-shaped multiconductor body for electrically coupling to said Hall effect device, the other end of said L-shaped multiconductor body adapted for electrically coupling to a controller circuit board;

removably coupling said other end of said L-shaped multiconductor body to said controller to establish electrical contact between said multiconductor body and said controller during motor operation, said controller having a flexible circuit connector for receiving said other end of said L-shaped multiconductor body;

soldering said second arm to said surface mount Hall effect device to establish electrical contact between said second arm and said surface mount Hall effect device;

adhesively attaching said soldered surface mount Hall effect device to said top portion of said bearing assembly proximate to said fixed Hall magnet to allow precision sensing of the angular displacement of the rotor shaft from a pre-determined rotor shaft angular null position by said Hall effect device during motor operation;

providing a snap-action retainer cap for removably coupling said first multiconductor arm to the commutator; and coupling said first multiconductor arm to the commutator with said snap-action retainer cap to establish electrical contact between said first multiconductor arm and the commutator so as to allow said controller to control the limited angular rotation of the rotor about the longitudinal rotor axis, said coupling allowing a portion of said first multiconductor arm to flex in consonance with the controlled limited angular rotation of the rotor about the longitudinal rotor axis during motor operation.

28. A rotor limited angle torque motion control system for use with a DC motor having a hollow cylindrical stator having embedded permanent magnets and a rotor having winding coils and commutator with a plurality of commutator segments mounted concentrically on a rotor shaft along the longitudinal rotor axis for mounting in a housing adapted for receiving and supporting the rotor shaft, said rotor limited angle torque motion control system comprising:

a controller operatively associated with the rotor for rotating the rotor in a controlled limited angular fashion about the longitudinal rotor axis in response to an external rotor shaft angular displacement command signal;

a sensor coupled to the housing for sensing the limited angular rotation of the rotor about the longitudinal rotor axis, said sensor producing a feedback signal representative of the rotor shaft angular displacement from a pre-determined rotor shaft angular null position; and a circuit for electrically coupling said controller to the commutator and said sensor to said controller, said controller receiving and comparing said feedback signal with said external rotor shaft angular displacement command signal and generating a corresponding rotor motion control error signal, said controller communicating said rotor motion control error signal to the commutator to control the limited angular rotation of the rotor about the longitudinal rotor axis, said circuit having at least one portion flexing in consonance with the controlled limited angular rotation of the rotor about the longitudinal rotor axis during motor operation.

29. A rotor limited angle torque motion control system for use with a DC motor including a hollow cylindrical stator having embedded permanent magnets and a rotor having winding coils and commutator with a plurality of commutator segments mounted concentrically on a rotor shaft along the longitudinal rotor axis, said rotor limited angle torque motion control system comprising:

a bearing assembly mounted on the rotor shaft proximate to the commutator;

a controller operatively associated with the rotor for rotating the rotor in a controlled limited angular fashion about the longitudinal rotor axis in response to an external rotor shaft angular displacement command signal;

a sensor coupled to said bearing assembly for sensing the limited angular rotation of the rotor about the longitudinal rotor axis, said sensor producing a feedback signal representative of the rotor shaft angular displacement from a pre-determined rotor shaft angular null position; and a circuit for electrically coupling said controller to the commutator and said sensor to said controller, said controller receiving and comparing said feedback signal with said external rotor shaft angular displacement command signal and generating a corresponding rotor motion control error signal, said controller communicating said rotor motion control error signal to the commutator to control the limited angular rotation of the rotor about the longitudinal rotor axis, said circuit having at least one portion flexing in consonance with the controlled limited angular rotation of the rotor about the longitudinal rotor axis during motor operation.

30. The rotor limited angle torque motion control system of claim 29, wherein said circuit is a flexible circuit having a plurality of flexible electrical conductors embedded between sheets of flexible insulating material.

31. The rotor limited angle torque motion control system of claim 30, wherein said flexible circuit comprises a plurality of multiconductor arms for coupling to the commutator and to said sensor, at least one of said multiconductor arms flexing in consonance with the controlled limited angular rotation of the rotor about the longitudinal rotor axis.

32. The rotor limited angle torque motion control system of claim 30, wherein said flexible circuit comprises a substantially L-shaped multiconductor body having a first multiconductor arm extending from one end of said body for removably coupling to the commutator and for flexing in consonance with the controlled limited angular rotation of the rotor about the longitudinal rotor axis and a second multiconductor arm extending upstream from said first multiconductor arm away from said L-shaped multiconductor body for coupling to said sensor, said L-shaped multiconductor body having its other end adapted for removably coupling to said controller.

33. The rotor limited angle torque motion control system of claim 32, wherein said first multiconductor arm of said flexible circuit includes a hand portion having a palm and a plurality of electrically conductive fingers for establishing electrical contact with some of the commutator segments, said fingers spaced apart in a configuration allowing said controller to communicate with the rotor when said fingers are in electrical contact with some of the commutator segments.

34. The rotor limited angle torque motion control system of claim 33, wherein said palm is substantially shaped like a ring for mounting concentrically on the rotor shaft, said ring 10 having an inner diameter larger than the diameter of the rotor shaft for accommodating the rotor shaft.

35. The rotor limited angle torque motion control system of claim 34, wherein each of said fingers includes an end portion adapted for conducting current to a single commutator segment.

36. The rotor limited angle torque motion control system of claim 35, further comprising means for coupling said hand portion to the commutator.

37. The rotor limited angle torque motion control system of claim 36, wherein said coupling means includes a snap-action retainer for fixing said hand portion to said commutator, wherein said fingers of said hand portion a re in electrical contact with some of the commutator segments under said retainer allowing said controller to control the limited angular rotation of the rotor about the longitudinal rotor axis during motor operations.

38. The rotor limited angle torque motion control system of claim 37, wherein said snap-action retainer is substantially shaped like a cap including a ring-shaped base for mounting concentrically on the rotor shaft, said ring-shaped base having an inner diameter larger than the diameter of the rotor shaft for accommodating the rotor shaft.

39. The rotor limited angle torque motion control system of claim 38, wherein said snap-action retainer cap further includes a plurality of inner walls recessed inwardly and emanating from said ring-shaped base for securing said electroconductive end portions of said fingers against respective commutator segments.

40. The rotor limited angle torque motion control system of claim 29, wherein said mounted bearing assembly has a top portion and a bottom portion, said bottom portion facing the commutator.

41. The rotor limited angle torque motion control system of claim 40, wherein said sensor comprises a Hall effect device for coupling to said top portion of said mounted bearing assembly and a Hall magnet for coupling to the rotor shaft proximate to said Hall effect device.

42. The rotor limited angle torque motion control system of claim 41, wherein said Hall effect device is a surface mount Hall effect device.

43. The rotor limited angle torque motion control system of claim 42 wherein said Hall magnet is a permanent magnet shaped substantially like a ring for mounting on the rotor shaft, said ring having an inner diameter larger than the diameter of the rotor shaft for accommodating the rotor shaft.

44. The rotor limited angle torque motion control system of claim 43 wherein said ring-shaped permanent Hall magnet is fixed on the rotor shaft proximate to said surface mount Hall effect device, said surface mount Hall effect device measuring variations in magnetic flux generated by said fixed Hall magnet as a result of angular displacement of the rotor shaft, said Hall effect device producing a corresponding feedback signal representative of the rotor shaft angular displacement from said predetermined rotor shaft angular null position.

45. The rotor limited angle torque motion control system of claim 44 wherein said flexible circuit comprising a substantially L-shaped multiconductor body having a first multiconductor arm and a second multiconductor arm, said second multiconductor arm includes an end portion adapted for electrically coupling to said surface mount Hall effect device.

46. The rotor limited angle torque motion control system of claim 45 further comprising means for coupling said adapted end portion of said second multiconductor arm to said surface mount Hall effect device.

47. The rotor limited angle torque motion control system of claim 46 wherein said coupling means includes soldering said adapted end portion of said second arm directly to said surface mount Hall effect device.

48. The rotor limited angle torque motion control system of claim 47, further comprising means for coupling said soldered surface mount Hall effect device to said top portion of said bearing assembly.

49. The rotor limited angle torque motion control system of claim 48, wherein said coupling means comprises a recess provided in said top portion of said bearing assembly for accommodating said soldered surface mount Hall effect device, said soldered surface mount Hall effect device adhesively attached to the bottom of said recesses.

50. The rotor limited angle torque motion control system of claim 49, wherein said controller is an electronic circuit board comprising at least a pulse width modulator integrated circuit (IC) chip.

51. The rotor limited angle torque motion control system of claim 50, wherein said circuit board further comprises a surface mounted flexible circuit connector for connecting to one end of said L-shaped multiconductor body of said flexible circuit.

52. The rotor limited angle torque motion control system of claim 51, wherein one end of said L-shaped multiconductor body of said flexible circuit has an electroconductive portion adapted for mating with said surface mounted flexible circuit connector.

53. The rotor limited angle torque motion control system of claim 45, wherein said bottom portion of said bearing assembly is provided with a cutout for accommodating a portion of said L-shaped multiconductor body, said portion being between said first multiconductor arm and said second multiconductor arm.

54. A method for improving the limited angle torque performance of a DC brush motor having a stator, brush assembly and a rotor, the rotor having winding coils and a commutator with commutator segments mounted concentrically on a rotor shaft along the longitudinal rotor axis for mounting in a housing adapted for receiving and supporting the rotor shaft, the method comprising the steps of:

providing a DC brush motor;

removing the brush assembly from said DC brush motor;

providing a surface mount Hall effect device;

providing a permanent ring-shaped Hall magnet;

mounting said permanent ring-shaped Hall magnet on the motor shaft away from the commutator;

adhesively fixing said mounted Hall magnet to the rotor shaft;

providing a controller for rotating the rotor in a controlled limited angular fashion about the longitudinal rotor axis;

providing a flexible circuit including a substantially L-shaped multiconductor body having a first multiconductor arm extending from one end of said body for electrically coupling to the commutator and for flexing in consonance with the controlled limited angular rotation of the rotor about the longitudinal rotor axis, a second multiconductor arm extending upstream from said first multiconductor arm away from said L-shaped multiconductor body for electrically coupling to said Hall effect device, said other end of said L-shaped multiconductor body adapted for electrically coupling to a controller circuit board;

removably coupling said other end of said L-shaped multiconductor body to said controller to establish electrical contact between said multiconductor body and said controller during motor operation, said controller having a flexible circuit connector for receiving said other end of said L-shaped multiconductor body;

soldering said second arm to said surface mount Hall effect device to establish electrical contact between said second arm and said surface mount Hall effect device;

adhesively attaching said soldered surface mount Hall effect device to the housing proximate to said fixed Hall magnet to allow precision sensing of the angular displacement of the rotor shaft from a pre-determined rotor shaft angular null position by said Hall effect device during motor operation;

providing a snap-action retainer cap for removably coupling said first multiconductor arm to the commutator; and coupling said first multiconductor arm to the commutator with said snap-action retainer cap to establish electrical contact between said first multiconductor arm and the commutator so as to allow said controller to control the limited angular rotation of the rotor about the longitudinal rotor axis, said coupling allowing a portion of said first multiconductor arm to flex in consonance with the controlled limited angular rotation of the rotor about the longitudinal rotor axis during motor operation.

\* \* \* \* \*